US005374575A

United States Patent [19]

Kim et al.

[11] Patent Number: 5,374,575

[45] Date of Patent: Dec. 20, 1994

[54] METHOD FOR FABRICATING MOS TRANSISTOR

[75] Inventors: Young K. Kim, Kyungki; Kyung S. Kim; Min H. Park, both of Seoul, all of Rep. of Korea

[73] Assignee: Goldstar Electron Co., Ltd., Rep. of Korea

[21] Appl. No.: 156,462

[22] Filed: Nov. 23, 1993

[51] Int. Cl.$^5$ .......... H01L 21/265

[52] U.S. Cl. .......... 437/44; 437/40; 437/41; 437/45; 437/56; 437/57; 437/203

[58] Field of Search .......... 437/40, 41, 44, 45, 437/56, 57, 89, 191, 203, 34

[56] References Cited

U.S. PATENT DOCUMENTS

| | | | |
|---|---|---|---|
| 4,577,392 | 3/1986 | Peterson | 437/45 |
| 4,597,824 | 7/1986 | Shinada et al. . | |
| 4,745,082 | 5/1988 | Kwok | 437/44 |
| 4,907,048 | 3/1990 | Huang . | |
| 4,939,154 | 7/1990 | Shimbo | 437/41 |
| 4,948,745 | 8/1990 | Pfiester et al. | 437/57 |
| 4,963,504 | 10/1990 | Huang . | |
| 4,984,042 | 1/1991 | Pfiester et al. . | |
| 4,997,778 | 3/1991 | Sim et al. | 437/40 |
| 5,061,975 | 10/1991 | Inuishi et al. . | |
| 5,082,794 | 1/1992 | Pfiester et al. . | |
| 5,175,119 | 12/1992 | Matsutani . | |
| 5,200,352 | 4/1993 | Pfiester | 437/34 |
| 5,238,859 | 8/1993 | Kamijo et al. | 437/44 |
| 5,270,234 | 12/1993 | Huang et al. | 437/45 |

*Primary Examiner*—Tom Thomas
*Assistant Examiner*—Kevin M. Picardat
*Attorney, Agent, or Firm*—Poms, Smith, Lande & Rose

[57] ABSTRACT

A method for fabricating an LDD MOS transistor having an improved structure capable of simplifying the fabrication and improving characteristics of the transistor. The methods includes the steps of forming a field oxide film for an active region isolation on a silicon substrate, thickly depositing an oxide film and etching the thick oxide film to form a first opening over an active region, forming side wall spacers in the first opening, implanting p type impurity ions in the silicon substrate through the first opening to form a channel region, filling the first opening with a first polysilicon film, removing the spacers to form second openings respectively in both sides of the first polysilicon film, implanting n type impurity ions in the silicon substrate through the second openings to form low concentration source and drain regions respectively disposed adjacent to both lateral ends of the channel region, removing the first polysilicon film to form a third opening, growing an oxide film over the resulting structure to form a gate oxide film, filling the third opening with a second polysilicon film, patterning the gate oxide film, and implanting n type impurity ions in the silicon substrate to form high concentration source and drain regions respectively disposed adjacent to the low concentration source and drain regions.

10 Claims, 11 Drawing Sheets

75 76 77 n+ n- p n- n+ 73

F I G.6b
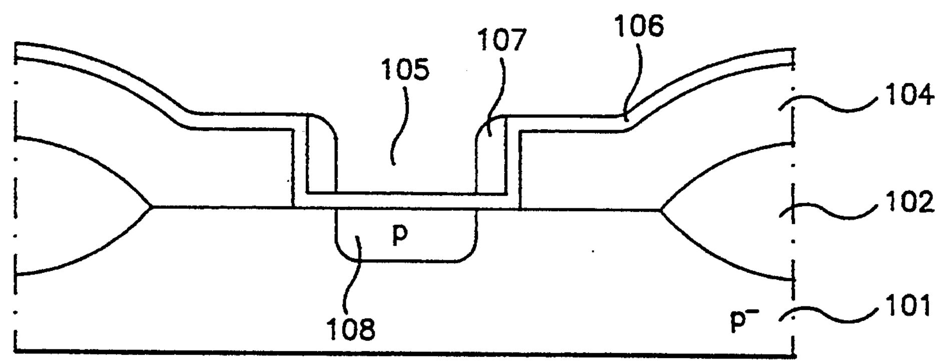
F I G.6c
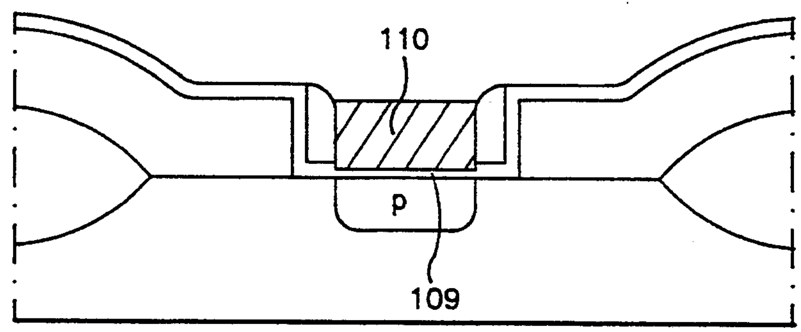
F I G.6d
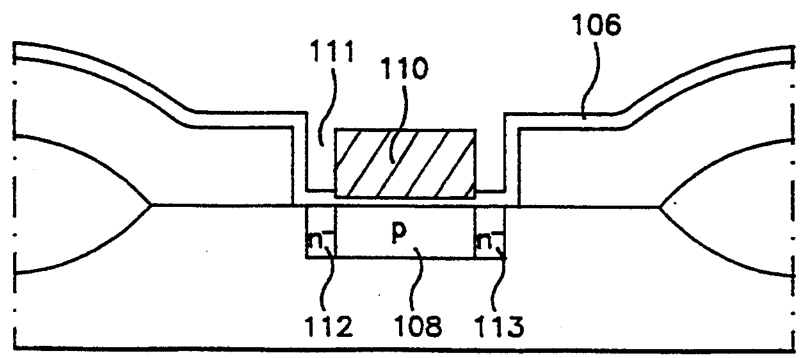

METHOD FOR FABRICATING MOS TRANSISTOR

BACKGROUND OF THE INVENTION

The present invention relates to a method for fabricating a MOS transistor having a lightly doped drain structure capable of simplifying the fabrication and improving characteristics of the transistor.

In case of MOS transistors having a high integrity, a high electric field may occur at edge portions of a gate electrode formed, thereby causing a generation of hot carriers. These hot carriers serve to degrade an operation characteristic of MOS transistors and reduce the use life of the MOS transistors.

For eliminating such a hot carrier effect, a lightly doped drain (LDD) structure has been proposed which includes a highly doped impurity region and a lightly doped impurity region disposed adjacent to the highly doped impurity region.

FIG. 1 is a sectional view of a general n type LDD transistor.

For fabricating this n type LDD transistor, an oxide film and a polysilicon film are formed over a p type semiconductor substrate 11. These films are then patterned to form a gate oxide film 15 and a gate in a channel region. Using the gate 16 as a mask, n type impurity ions are implanted in a low concentration in the substrate to form a low concentration source/drain region 13. An oxide film is deposited over the entire exposed surface of the substrate 11 and then subjected to an anisotropic etching to form side wall spacers 17. Finally, n type impurity ions are implanted in a high concentration in the substrate 11 using the side wall spacers 17 as a mask, thereby forming a high concentration source/drain region 14.

In this LDD MOS transistor shown in FIG. 1, however, hot carriers generated are trapped in the oxide film 17 on the low concentration source/drain region 13. As a result, there is a problem that series resistance for reducing transconductance of the transistor may be modulated.

For solving such a problem, there has been proposed an inverse-T gate LDD MOS transistor wherein a gate has an inverse-T structure including a thick portion disposed at a channel region and a thin portion overlapped with a low concentration source/drain region.

FIGS. 2A to 2F are sectional views respectively illustrating a method for fabricating an LDD MOS transistor having a conventional inverse-T gate structure.

In accordance with this method, a thin oxide film 22 is formed over a silicon substrate 21, as shown in FIG. 2A. Over the oxide film 22, a thick polysilicon film 23 is coated. Another oxide film 24 is then formed over the polysilicon film 23. Thereafter, a photoresist film 25 is coated over the oxide film 24. The photoresist film 25 is then photo-etched to form a desired pattern. As a result, the oxide film 24 is exposed at its portions other than a portion disposed beneath the patterned photoresist film 25.

Using the patterned photoresist film 25 as a mask, the oxide film 24 is then etched, thereby causing the polysilicon film 23 to be partially exposed, as shown in FIG. 2B. The exposed portion of polysilicon film is then etched to a predetermined depth from its surface. As a result, the polysilicon film 23 still has its initial thickness at its portion 23A corresponding to the channel region whereas it has a reduced thickness at its portion 23B other than the portion 23A.

Thereafter, the remaining photoresist film 25 is removed, as shown in FIG. 2C. After removal of the photoresist film 25, n type impurity ions are implanted in the silicon substrate 21 so as to form low concentration n type source and drain regions 26 and 27. At this time, the oxide film 24 serves to prevent the impurity ions from being implanted in the silicon substrate 21 through the thick portion 23A of the polysilicon film 23. In other words, the impurity ions are implanted in the silicon substrate 21 only through the thin portion 23B of the polysilicon film 23.

Over the entire exposed surface of the resulting structure, another oxide film is thickly deposited, as shown in FIG. 2D. The oxide film is then subjected to an anisotropic etching to form side wall spacers 28.

Using the side wall spacers 28 as a mask, the thin polysilicon film portion 23B is etched so as to form a gate having an inverse-T structure including a leg portion corresponding to the thick polysilicon film portion 23A and a top portion corresponding to the thin polysilicon film portion 23B, as shown in FIG. 2E.

Subsequently, n type impurity ions are implanted in the silicon substrate 21 using the side wall spacers 28, the oxide film 24 and the gate 23 as a mask, thereby forming a high concentration n type source and drain regions 29 and 30, as shown in FIG. 2F.

Finally, the side wall spacers 28 are removed. Thus an LDD MOS transistor is obtained which includes the inverse-T gate 23 overlapped at its top portion 23B with the low concentration source and drain regions 26 and 27.

The above-mentioned method for fabricating the conventional LDD MOS transistor having the inverse-T gate involves a difficulty to accurately control the step of etching the polysilicon film to form the inverse-T gate. As a result, it is difficult to fabricate a desired transistor.

FIGS. 3A to 3F illustrate a method for fabricating an LDD MOS transistor having an improved inverse-T gate, respectively.

In accordance with this method, a p type silicon substrate 41 is subjected to a well-known field oxidation to form an isolation field oxide film 42, as shown in FIG. 3A. A gate oxide film 44 is then grown over an active region 43 of the p type silicon substrate 41. Over the gate oxide film 44, a first polysilicon film 45 is then deposited. A low temperature oxide (LTO) film 46 is deposited over the first polysilicon film 45 and then etched to form an opening 47.

Over the entire exposed surface of the resulting structure, a nitride film is then etched, as shown in FIG. 3B. The nitride film is subjected to an anisotropic etching to form spacers 48 at respective side walls of the LTO film 46. Using the spacers 48 as a mask, impurity ions are implanted in the silicon substrate 41 through the opening 47, thereby forming a p type channel region 49.

Thereafter, a selected deposition of a second polysilicon film 50 is carried out for filling the opening 47 with the second polysilicon film 50, as shown in FIG. 3C. The second polysilicon film 50 filling the opening 47 constitutes a leg portion of an inverse-T gate to be obtained.

Using the second polysilicon film 50 and the spacer 48 as a mask, the LTO film 46 is completely removed, as shown in FIG. 3D. As a result, the first polysilicon film is exposed at its portion other than its portions beneath the spacers 48 and the second polysilicon film 50. Then, n type impurity ions are implanted in a high concentration in the silicon substrate 41 using the second polysilicon film 50 and the spacers 48 as a mask, thereby forming high concentration source and drain regions 51 and 52 in both sides of the channel region 49, respectively.

After the ion implantation, the exposed portion of first polysilicon film 45 is etched using the spacers 48 as a mask, as shown in FIG. 3E. At this time, the remaining first polysilicon film 45 constitutes a top portion of an inverse-T gate to be obtained. Thus an inverse-T gate 53 is obtained which has a top portion constituted by the first polysilicon film 45 and a leg portion constituted by the second polysilicon film 50.

Thereafter, the side wall spacers 48 are removed, as shown in FIG. 3F. Finally, n type impurity ions are implanted in a low concentration in the silicon substrate 41, thereby forming low concentration source and drain regions 54 and 55 between the channel region 49 and the high concentration source region 51 and between the channel region 49 and the high concentration drain region 52, respectively.

Thus a MOS transistor is obtained which has an LDD structure including the inverse-T gate 53 constituted by the first polysilicon film 45 and the second polysilicon film 50, the low concentration source and drain regions 54 and 55, and the high concentration source and drain regions 51 and 52.

However, since the gate oxide film is grown at the early stage of the fabrication in accordance with this method, it may be damaged at subsequent etching steps. As a result, the reliability may be degraded. This method also involves a problem that the resistance of the gate itself is increased because the inverse-T gate is constituted by two polysilicon films.

SUMMARY OF THE INVENTION

The present invention has been made in view of the above-mentioned problems encountered in the prior arts and an object of the invention is to provide a method for fabricating an LDD MOS transistor having an improved structure capable of simplifying the fabrication and improving characteristics of the transistor.

In accordance with the present invention, this object can be accomplished by providing a method for fabricating a MOS transistor, comprising the steps of: subjecting a silicon substrate of a first conductivity type to a field oxidation, thereby forming a field oxide film for an active region isolation; thickly depositing an oxide film over the entire exposed surface of the resulting structure after the formation of said field oxide film and etching said thick oxide film, thereby forming a first opening over an active region; growing a thin oxide film over the entire exposed surface of the resulting structure after the formation of said first opening; forming spacers at respective side walls of said thin oxide film disposed in said first opening; implanting impurity ions of the first conductivity type in said silicon substrate through the first opening under a condition that said spacers are used as a mask, thereby forming a channel region; partially removing the thin oxide film at its portion disposed over said channel region, thereby partially exposing the silicon substrate through the first opening; depositing a first polysilicon film, thereby filling the first opening with said first polysilicon film; removing the spacers, thereby forming a pair of second openings respectively in both sides of the first polysilicon film; implanting impurity ions of a second conductivity type in a low concentration in the silicon substrate through said second openings, thereby forming low concentration source and drain regions respectively disposed adjacent to both lateral ends of the channel region; removing the first polysilicon film, thereby forming a third opening for exposing the channel region and said low concentration source and drain regions; growing an oxide film over the entire exposed surface of the resulting structure after the formation of said third opening, thereby forming a gate oxide film; depositing a second polysilicon film, thereby filling the third opening with said second polysilicon film; patterning the gate oxide film under a condition that the second polysilicon film is used as a mask; removing the remaining thick oxide film; and implanting impurity ions of the second conductivity type in a high concentration in the silicon substrate under a condition that the second polysilicon film is used as a mask, thereby forming high concentration source and drain regions respectively disposed adjacent to the low concentration source and drain regions.

BRIEF DESCRIPTION OF THE DRAWINGS

Other objects and aspects of the invention will become apparent from the following description of embodiments with reference to the accompanying drawings in which:

FIGS. 6A to 6G are sectional views respectively illustrating a method for fabricating an LDD MOS transistor in accordance with a third embodiment of the present invention.

DETAILED DESCRIPTION OF THE PREFERRED EMBODIMENTS

FIGS. 4A to 4F are sectional views respectively illustrating a method for fabricating an LDD MOS transistor in accordance with a first embodiment of the present invention.

Figure 1:
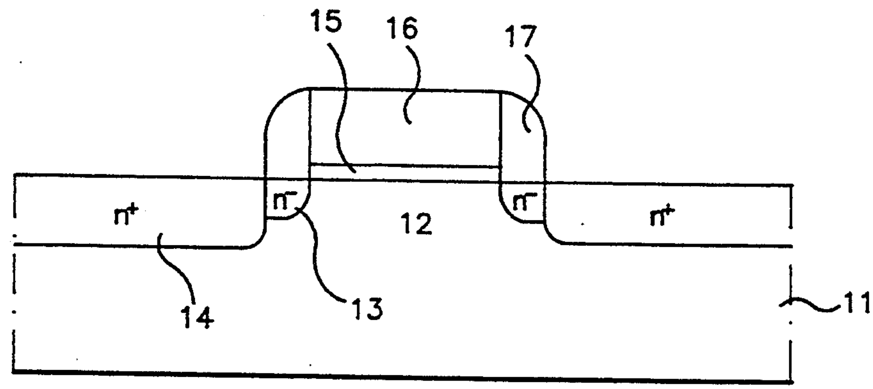
FIG. 1 is a sectional view of a general n type LDD transistor.
Figure 2A:
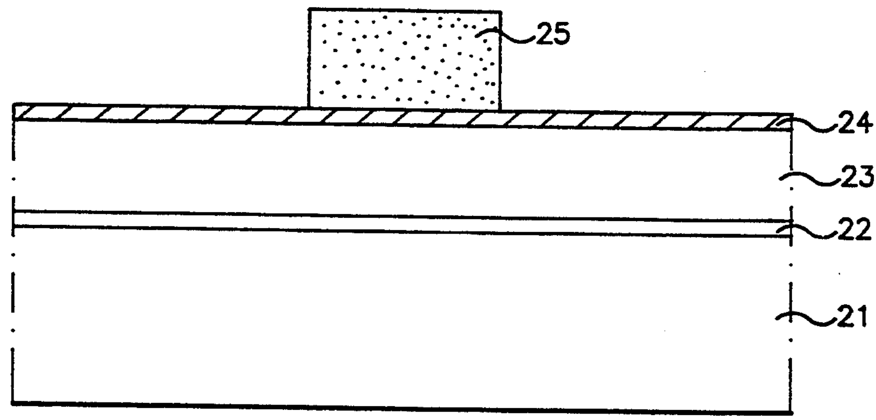
FIGS. 2A to 2F are sectional views respectively illustrating a method for fabricating an LDD MOS transistor having a conventional inverse-T gate structure.
Figure 2B:
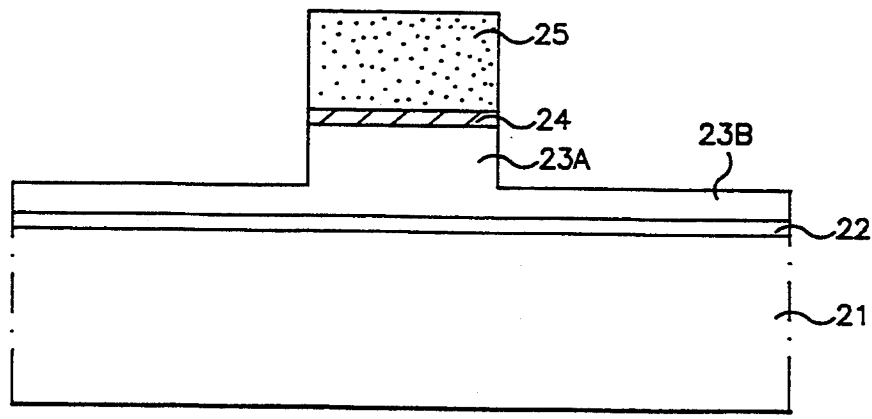
Figure 2C:
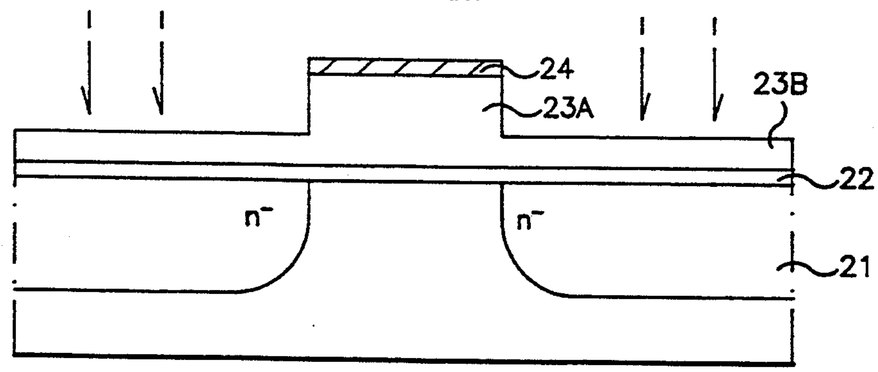
Figure 2D:
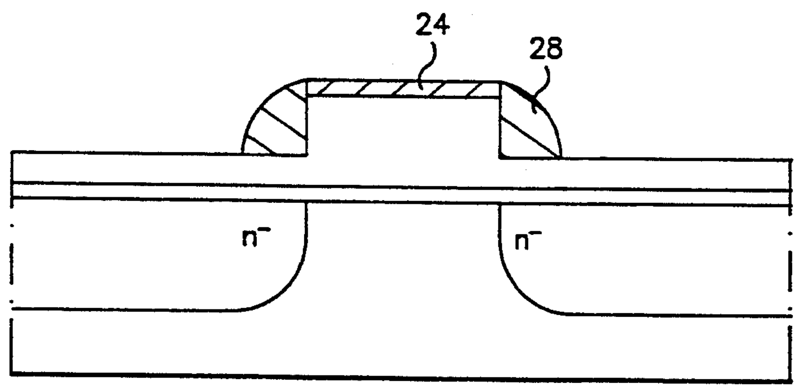
Figure 2E:
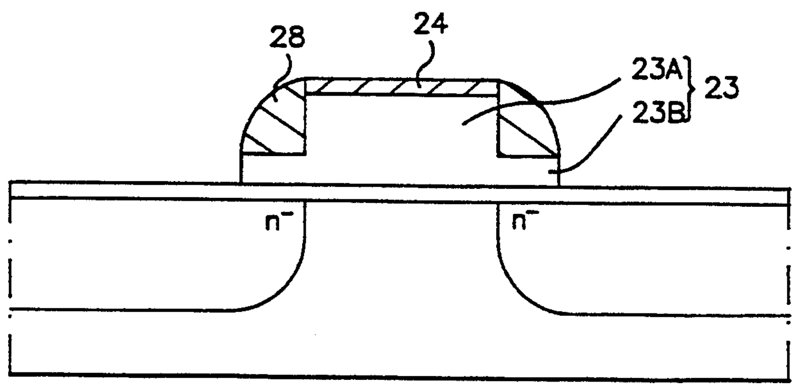
Figure 2F:
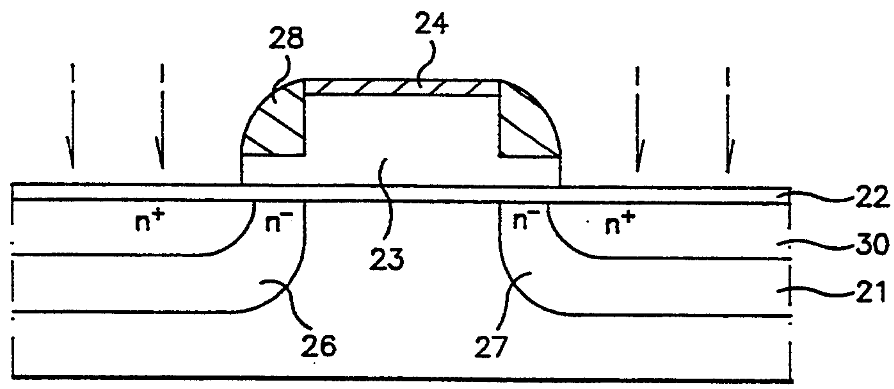
Figure 3A:
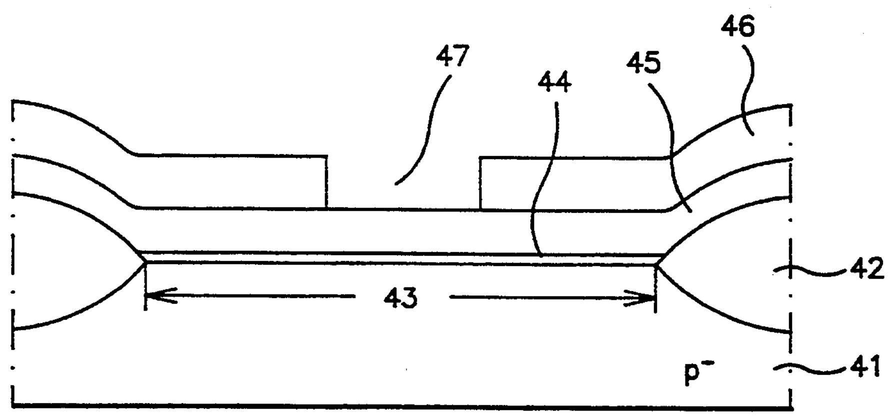
FIGS. 3A to 3F are sectional views respectively illustrating a method for fabricating an LDD MOS transistor having an improved inverse-T gate.
Figure 3B:
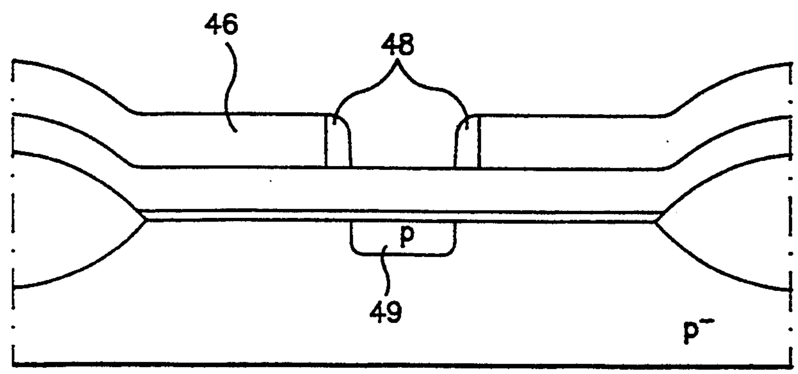
Figure 3C:
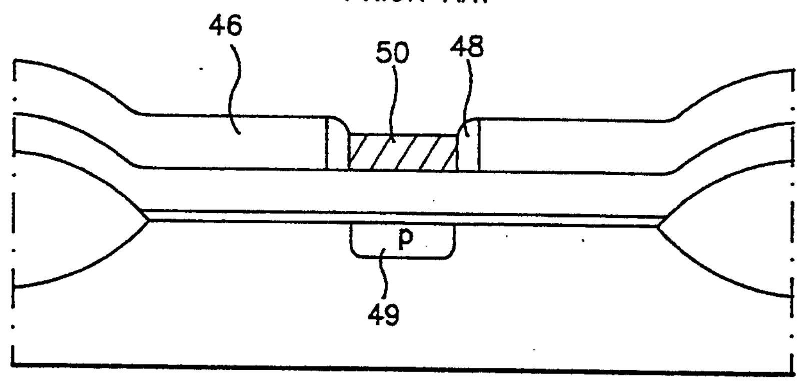
Figure 3D:
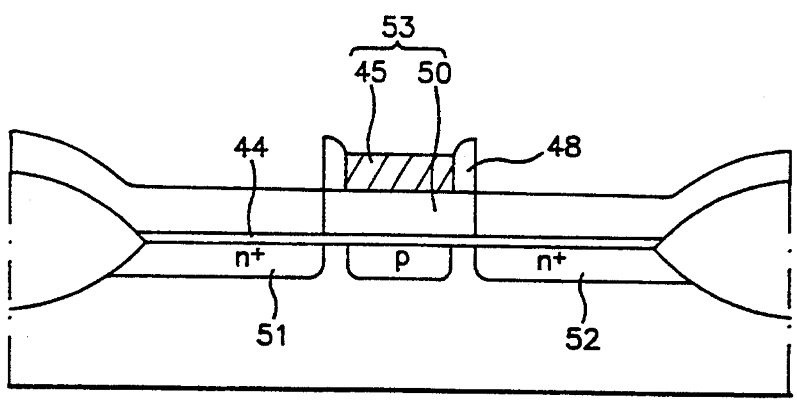
Figure 3E:
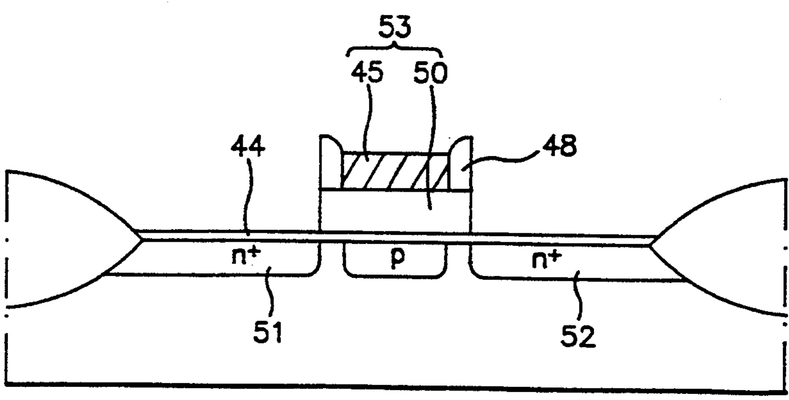
Figure 3F:
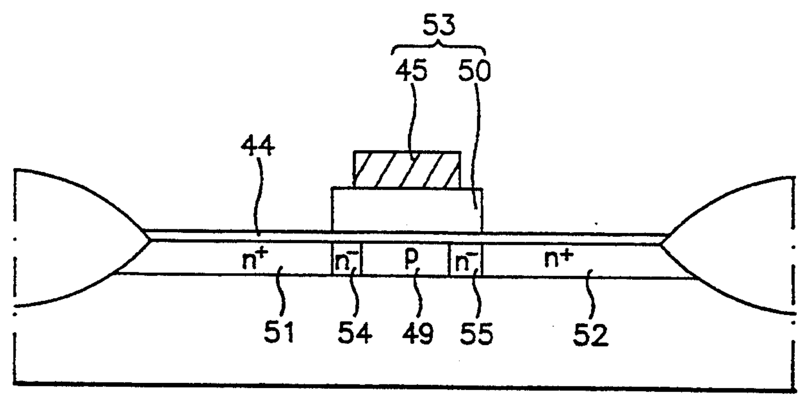
Figure 4A:
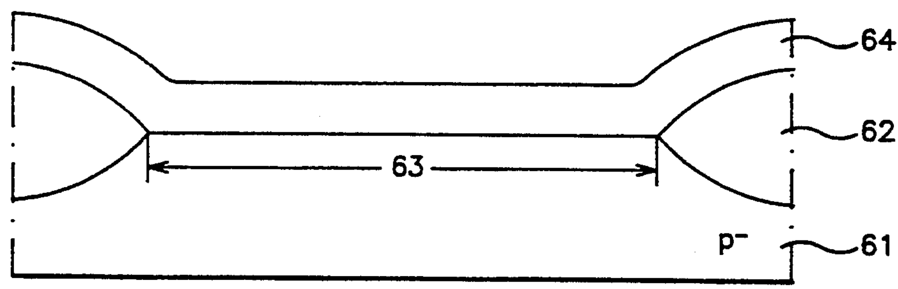
FIGS. 4A to 4F are sectional views respectively illustrating a method for fabricating an LDD MOS transistor in accordance with a first embodiment of the present invention.
Figure 4B:
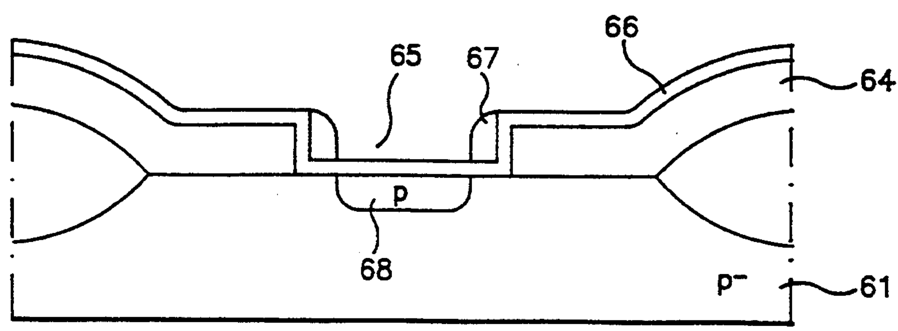

In accordance with this method, a p type silicon substrate 61 is subjected to a well-known field oxidation to form an isolation field oxide film 62, as shown in FIG. 4A. An oxide film 64 is then thickly deposited over the entire exposed surface of the resulting structure. In FIG. 4A, the reference numeral 63 denotes an active region.

The oxide film 64 is then etched to form an opening 65. As a result, the silicon substrate 61 is partially exposed at its portion corresponding to the active region 63 through the opening 65. Over the entire exposed surface of the resulting structure, a thin oxide film 66 is then grown. Thereafter, an insulating film exhibiting an etch rate different from that of the oxide film 66 is deposited over the entire exposed surface of the resulting structure. The insulating film is then etched back to form side wall spacers 67 in the opening 65. The insulating film for the spacers are comprised of a nitride film. Using the spacers 67 as a mask, p type impurity ions are then implanted in the silicon substrate 61 through the opening 65, thereby forming a p type channel region 68.

Figure 4C:
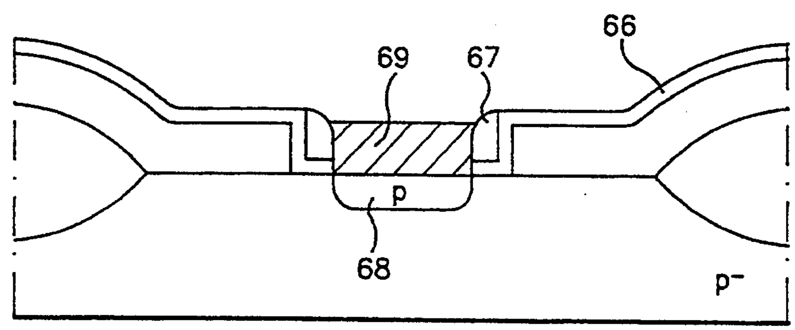

As shown in FIG. 4C, the thin oxide film 66 is then partially etched so that its portion deposited over the p type channel region 68 can be removed. Subsequently, a first polysilicon film 69 is selectively deposited over the p type channel region 68 in the opening 65 so as to fill the opening 65 with the first polysilicon film 69.

Figure 4D:
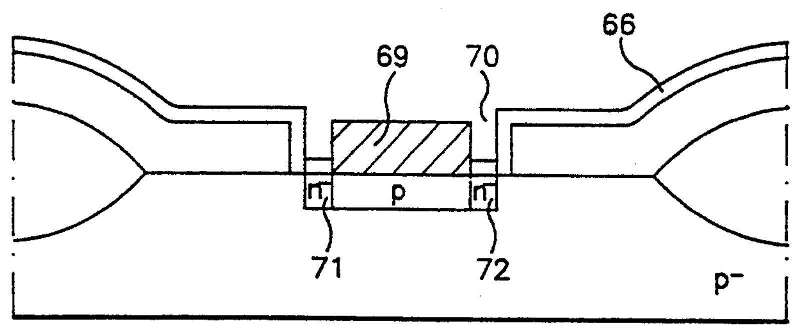

Thereafter, the side wall spacers 67 are removed, as shown in FIG. 4D. By the removal of the side wall spacers 67, an opening 70 is formed. Impurity ions are then implanted in the silicon substrate 61 through the opening 70, thereby forming low concentration source and drain regions 71 and 72. The low concentration source and drain regions 71 and 72 are disposed adjacent to both lateral ends of the p type channel region 68, respectively.

Figure 4E:
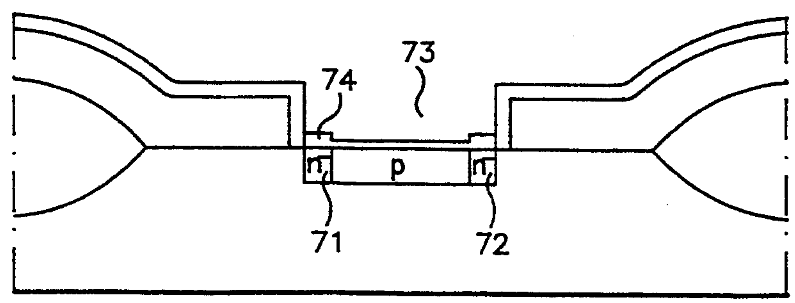

Subsequently, the selectively deposited first polysilicon film 69 is removed, thereby forming an opening 73, as shown in FIG. 4E. A thin oxide film is then grown in the opening 73 so as to form a gate oxide film 74. The gate oxide film 74 has a thinner portion disposed over the p type channel region 68 and thicker portions respectively disposed over the low concentration source and drain regions 71 and 72.

Figure 4F:
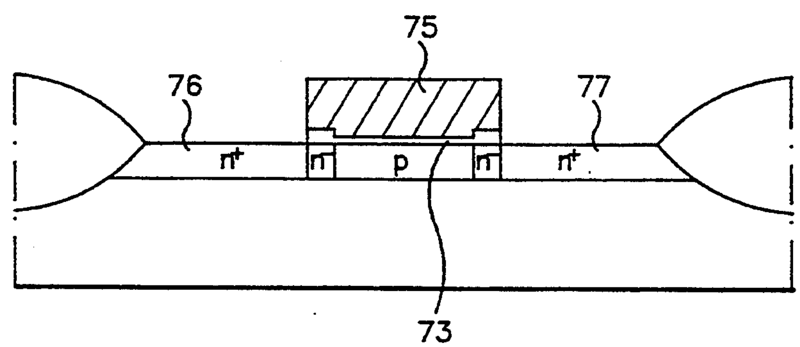

Then, a second polysilicon film 75 is selectively deposited to fill the opening 73, as shown in FIG. 4F. The second polysilicon film 75 constitutes a gate. After the selective deposition of the second polysilicon film 75, the gate oxide film 73 is patterned using the second polysilicon film 75, thereby completely removing the remaining oxide film 64. Using the second polysilicon film 75 as a mask, n type impurity ions are implanted in a high concentration in the silicon substrate 61 so as to form high concentration source and drain regions 76 and 77 respectively disposed adjacent to the low concentration source and drain regions 71 and 72.

Thus a MOS transistor is obtained which has an LDD structure including an inverse-T gate comprised of a single polysilicon film and having a thick top portion and a short leg portion, low concentration source and drain regions 56 and 55, and high concentration source and drain regions 51 and 52.

FIGS. 5A to 5G are sectional views respectively illustrating a method for fabricating an LDD MOS transistor in accordance with a second embodiment of the present invention.

Figure 5A:
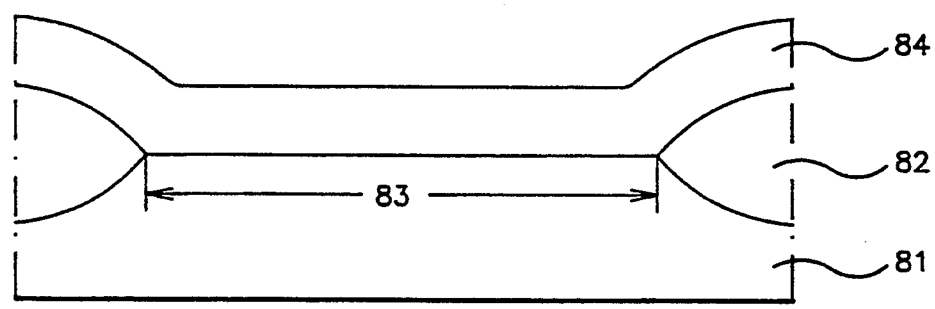
FIGS. 5A to 5G are sectional views respectively illustrating a method for fabricating an LDD MOS transistor in accordance with a second embodiment of the present invention.

In accordance with this method, a p type silicon substrate 81 is subjected to a well-known field oxidation to form an isolation field oxide film 82 for isolating adjacent active regions 83, as shown in FIG. 5A. An oxide film 84 is then thickly deposited over the entire exposed surface of the resulting structure.

Figure 5B:
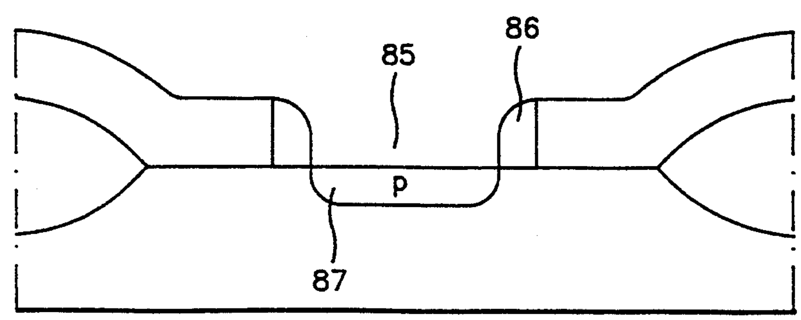

The oxide film 84 is then etched to form an opening 85, as shown in FIG. 5B. Over the entire exposed surface of the resulting structure, an insulating film comprised of a nitride film exhibiting an etch rate different from that of the oxide film 84 is deposited. The insulating film is then subjected to an anisotropic etching to form spacers 86 at respective side walls of the oxide film 84 in the opening 85. As a result, the silicon substrate 81 is partially exposed through the opening 85. Using the spacers 86 as a mask, p type impurity ions are then implanted in the silicon substrate 81, thereby forming a p type channel region 87.

Figure 5C:
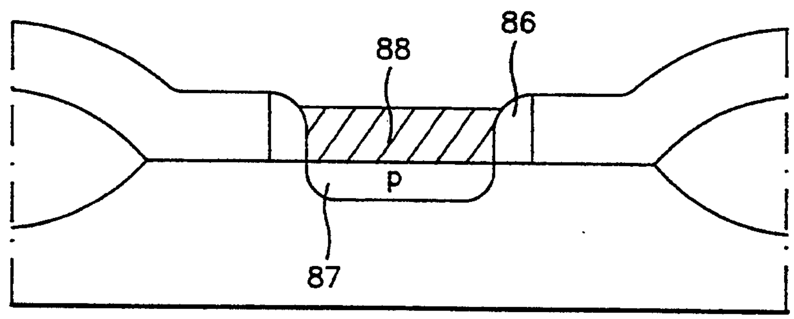

As shown in FIG. 5C, a first polysilicon film 88 is selectively deposited over the p type channel region, namely, the exposed portion of the silicon substrate 81 in the opening 85 so as to fill the opening 85 with the first polysilicon film 88.

Figure 5D:
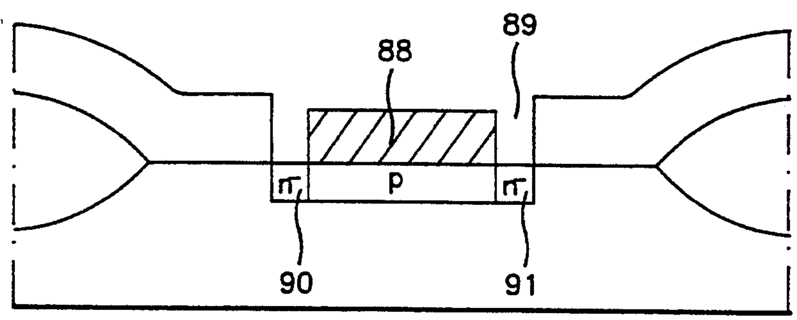

Thereafter, the side wall spacers 85 are etched so that openings 89 are formed in both sides of the first polysilicon film 88, respectively, as shown in FIG. 5D. Impurity ions are then implanted in a low concentration in the silicon substrate 81 through the openings 89, thereby forming low concentration source and drain regions 90 and 91. The low concentration source and drain regions 90 and 91 are disposed adjacent to both lateral ends of the p type channel region 87, respectively.

Figure 5E:
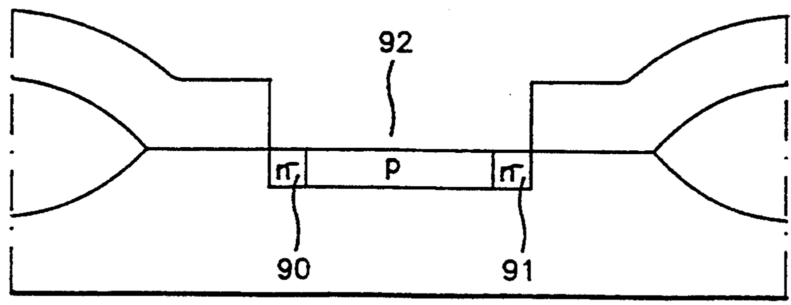

Subsequently, the first polysilicon film 88 is removed, thereby forming an opening 93, as shown in FIG. 5E. As a result, the silicon substrate 81 is exposed at its portions respectively corresponding to the low concentration source and drain regions 90 and 91 and the p type channel region 87.

Figure 5F:
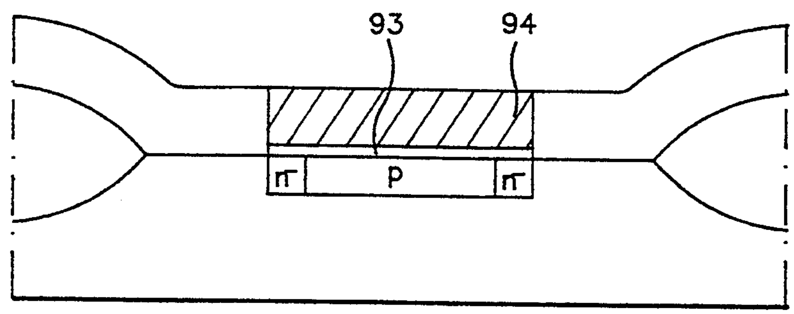

As shown in FIG. 5F, an oxide film is then grown over the exposed portions of the silicon substrate 81 so as to form a gate oxide film 93. A second polysilicon film 94 is then selectively deposited over the gate oxide film 93 so that the opening 92 is filled with the second polysilicon film 94. The second polysilicon film serves as a gate.

Figure 5G:
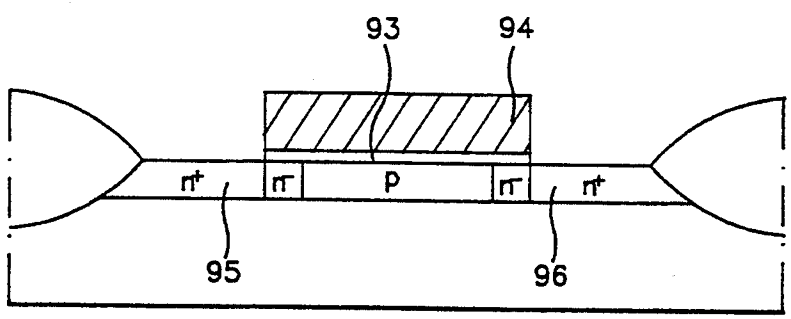

The oxide film 84 is then completely removed, as shown in FIG. 5G. Using the second polysilicon film 94 as a mask, n type impurity ions are implanted in a high concentration in the silicon substrate 81 so as to form high concentration source and drain regions 95 and 96. As a result, a MOS transistor is obtained which has an LDD structure including the gate 94 overlapped with the low concentration source and drain regions 90 and 91.

FIGS. 6A to 6G are sectional views respectively illustrating a method for fabricating an LDD MOS transistor in accordance with a third embodiment of the present invention.

Figure 6A:
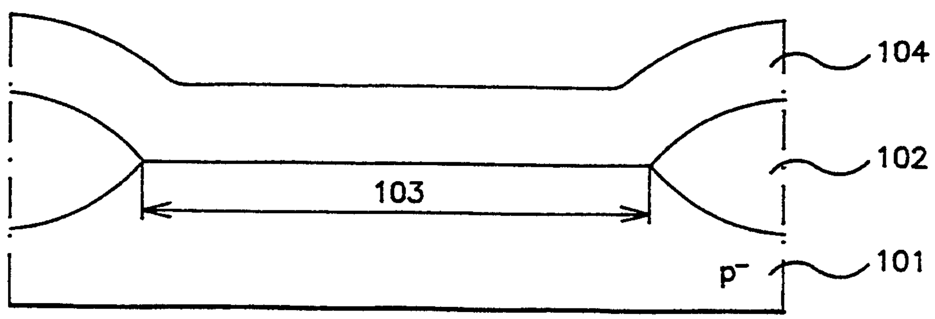

In accordance with this method, a p type silicon substrate 101 is subjected to a well-known field oxidation to form an isolation field oxide film 102 for isolating adjacent active regions 103, as shown in FIG. 6A. An oxide film 104 is then thickly deposited over the entire exposed surface of the resulting structure.

The oxide film 104 is then etched to form an opening 105, as shown in FIG. 6B. Over the entire exposed surface of the resulting structure, another oxide film 106 is formed to a thickness larger than a desired gate oxide film thickness. An insulating film comprised of a nitride film exhibiting an etch rate different from that of the oxide film 106 is deposited. The insulating film is then subjected to an anisotropic etching to form spacers 107 at respective side walls of the oxide film 106 in the opening 105. Using the spacers 107 as a mask, p type impurity ions are then implanted in the silicon substrate 101 through the opening 105, thereby forming a p type channel region 108.

As shown in FIG. 6C, the oxide film 106 is then partially etched to a predetermined depth using the spacers 107 as a mask so that its portion disposed over the p type channel region 108 forms a thin oxide film 109. Thereafter, a first polysilicon film 110 is selectively deposited over the thin oxide film 109 using the spacers 107 as a mask so as to fill the opening 105 with the first polysilicon film 110.

Thereafter, the side wall spacers 107 are removed so that openings 111 are formed in both sides of the first polysilicon film 110, respectively, as shown in FIG. 6D. Impurity ions are then implanted in a low concentration in the silicon substrate 101 through the openings 111, thereby forming low concentration source and drain regions 112 and 113. The low concentration source and drain regions 90 and 91 are disposed adjacent to both lateral ends of the p type channel region 108, respectively.

Figure 6E:
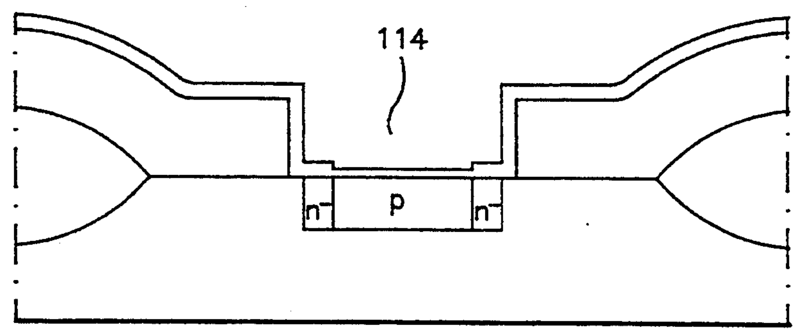

Subsequently, the first polysilicon film 110 is etched to form an opening 114, as shown in FIG. 6E.

Figure 6F:
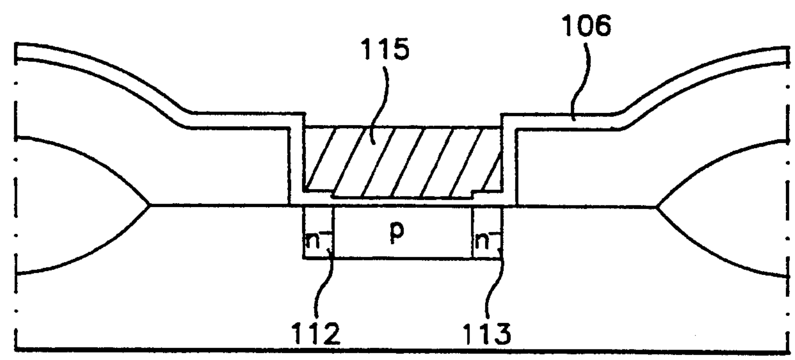
Figure 6G:
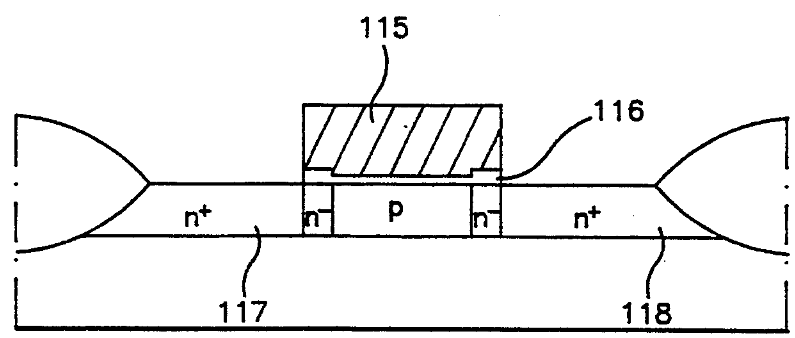

As shown in FIGS. 6F and 6G, a second polysilicon film 115 is then selectively deposited to fill the opening 114. Then, the oxide film 106 is patterned to form a gate oxide film 116. Following the patterning, the thick oxide film 104 is removed. Formation of high concentration n type source and drain regions 117 and 118 is then carried out.

As a result, a MOS transistor is obtained which has LDD structure including a T gate constituted by the gate oxide film 116 having a larger thickness at its portions respectively overlapped with the low concentration source and drain regions 117 and 118 and the single polysilicon film 115 having a thick top portion and a short leg portion, the high concentration source and drain regions 117 and 118, and the low concentration source and drain regions 112 and 113.

As apparent from the above description, the present invention provides a gate structure capable of greatly decreasing hot carrier effects and overlap capacitance because the gate structure includes a gate oxide film having a thick portion disposed at a channel region and a thin portion overlapped with a low concentration source/drain region. As a result, it is possible to reduce a gate induced drain leakage.

In accordance with the present invention, the low concentration source/drain region can be comprised of a nitride film. This can realize semiconductor devices having a micro structure.

Since the gate oxide film is formed at a final step in fabrication of a MOS transistor, any damages caused by subsequent etching steps can be avoided. As a result, the gate oxide film can exhibit an improved characteristic.

In accordance with the present invention, the gate is comprised of a single polysilicon film, as compared to the conventional structures. Accordingly, it is possible to reduce the resistance of the gate itself. In accordance with the present invention, the fabrication can be simplified because the polysilicon film does not require any etching step for forming the gate.

What is claimed is:

1. A method for fabricating a MOS transistor, comprising the steps of:

subjecting a silicon substrate of a first conductivity type to a field oxidation, thereby forming a field oxide film for an active region isolation;

thickly depositing an oxide film over the entire exposed surface of the resulting structure after the formation of said field oxide film and etching said thick oxide film, thereby forming a first opening over an active region;

growing a thin oxide film over the entire exposed surface of the resulting structure after the formation of said first opening;

forming spacers at respective side walls of said thin oxide film disposed in said first opening;

implanting impurity ions of the first conductivity type in said silicon substrate through the first opening under a condition that said spacers are used as a mask, thereby forming a channel region;

partially removing the thin oxide film at its portion disposed over said channel region, thereby partially exposing the silicon substrate through the first opening;

depositing a first polysilicon film, thereby filling the first opening with said first polysilicon film;

removing the spacers, thereby forming a pair of second openings respectively in both sides of the first polysilicon film;

implanting impurity ions of a second conductivity type in a low concentration in the silicon substrate through said second openings, thereby forming low concentration source and drain regions respectively disposed adjacent to both lateral ends of the channel region;

removing the first polysilicon film, thereby forming a third opening for exposing the channel region and said low concentration source and drain regions;

growing an oxide film over the entire exposed surface of the resulting structure after the formation of said third opening, thereby forming a gate oxide film;

depositing a second polysilicon film, thereby filling the third opening with said second polysilicon film;

patterning the gate oxide film under a condition that the second polysilicon film is used as a mask;

removing the remaining thick oxide film; and implanting impurity ions of the second conductivity type in a high concentration in the silicon substrate under a condition that the second polysilicon film is used as a mask, thereby forming high concentration source and drain regions respectively disposed adjacent to the low concentration source and drain regions.

2. A method in accordance with claim 1, wherein said spacers are comprised of an insulating film exhibiting an etch rate different from that of said thin oxide film.

3. A method in accordance with claim 2, wherein said insulating film is comprised of a nitride film.

4. A method in accordance with claim 1, wherein said first polysilicon film is selectively deposited over said exposed portion of the silicon substrate under a condition that said spacers are used as a mask so as to fill said first opening.

5. A method in accordance with claim 1, wherein said gate oxide film has a thinner portion disposed over said channel region and thicker portions respectively disposed over said low concentration source and drain regions.

6. A method in accordance with claim 1, wherein said second polysilicon film is selectively deposited over a portion of said gate oxide film disposed in said third opening so as to fill said third opening.

7. A method in accordance with claim 6, wherein said second polysilicon film serves as a gate.

8. A method in accordance with claim 6, wherein said second polysilicon film has a T-shaped structure including a relatively thick top portion and a relatively short leg portion.

9. A method for fabricating a MOS transistor, comprising the steps of:

subjecting a silicon substrate of a first conductivity type to a field oxidation, thereby forming a field oxide film for an active region isolation;

thickly depositing an oxide film over the entire exposed surface of the resulting structure after the formation of said field oxide film and etching said thick oxide film, thereby forming a first opening over an active region;

depositing an insulating film over the entire exposed surface of the resulting structure after the formation of said first opening and anisotropically etching said insulating film, thereby forming spacers at respective side walls of said thick oxide film disposed in said first opening such that said silicon substrate is partially exposed through the first opening;

implanting impurity ions of the first conductivity type in said silicon substrate under a condition that said spacers are used as a mask, thereby forming a channel region;

depositing a first polysilicon film over said channel region under a condition that the spacers are used as a mask, thereby filling the first opening with said first polysilicon film;

removing the spacers, thereby forming a pair of second openings respectively in both sides of the first polysilicon film;

implanting impurity ions of a second conductivity type in a low concentration in the silicon substrate through said second openings, thereby forming low concentration source and drain regions respectively disposed adjacent to both lateral ends of the channel region;

removing the first polysilicon film, thereby forming a third opening;

forming a gate oxide film over a portion of the silicon substrate disposed in said third opening;

depositing a second polysilicon film over said gate oxide film under a condition that the thick oxide film is used as a mask, thereby filling the third opening with said second polysilicon film;

removing the remaining thick oxide film; and implanting impurity ions of the second conductivity type in a high concentration in the silicon substrate under a condition that the second polysilicon film is used as a mask, thereby forming high concentration source and drain regions respectively disposed adjacent to the low concentration source and drain regions.

10. A method for fabricating a MOS transistor, comprising the steps of:

subjecting a silicon substrate of a first conductivity type to a field oxidation, thereby forming a field oxide film for an active region isolation;

thickly depositing a first oxide film over the entire exposed surface of the resulting structure after the formation of said field oxide film and etching said thick oxide film, thereby forming a first opening over an active region;

growing a second oxide film over the entire exposed surface of the resulting structure after the formation of said first opening to a thickness larger than a thickness of a gate oxide film to be formed;

forming spacers at respective side walls of said second oxide film disposed in said first opening;

implanting impurity ions of the first conductivity type in said silicon substrate under a condition that said spacers are used as a mask, thereby forming a channel region;

etching a portion of the second oxide film disposed over said channel region to a depth such that it has a thickness smaller than those of other portions of the second oxide film;

depositing a first polysilicon film over said thinner portion of the second oxide film under a condition that the spacers are used as a mask, thereby filling the first opening with said first polysilicon film;

removing the spacers, thereby forming a pair of second openings respectively in both sides of the first polysilicon film;

implanting impurity ions of a second conductivity type in a low concentration in the silicon substrate through said second openings, thereby forming low concentration source and drain regions respectively disposed adjacent to both lateral ends of the channel region;

removing the first polysilicon film, thereby forming a third opening for exposing the channel region and the low concentration source and drain regions;

depositing a second polysilicon film over said exposed channel region and low concentration source and drain regions, thereby filling said third opening with said second polysilicon film;

patterning the second polysilicon film under a condition that the second polysilicon film is used as a mask, thereby forming a gate oxide film;

removing the remaining first oxide film; and implanting impurity ions of the second conductivity type in a high concentration in the silicon substrate under a condition that the second polysilicon film is used as a mask, thereby forming high concentration source and drain regions respectively disposed adjacent to the low concentration source and drain regions.

* * * * *